(12) United States Patent
Venkatesan

(10) Patent No.: US 8,089,123 B2
(45) Date of Patent: Jan. 3, 2012

(54) SEMICONDUCTOR DEVICE COMPRISING TRANSISTOR STRUCTURES AND METHODS FOR FORMING SAME

(75) Inventor: Ananthan Venkatesan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/877,827

(22) Filed: Sep. 8, 2010

(65) Prior Publication Data

US 2011/0006365 A1 Jan. 13, 2011

Related U.S. Application Data

(62) Division of application No. 11/774,665, filed on Jul. 9, 2007, now Pat. No. 7,816,216.

(51) Int. Cl.
*H01L 29/78* (2006.01)

(52) U.S. Cl. ........... 257/330; 257/E29.262; 257/315; 257/E21.409; 257/E29.345; 438/259

(58) Field of Classification Search .......... 257/288, 257/329–331; 438/278, 270, 272, 296, 734, 438/589, 197, 700, 598
See application file for complete search history.

(56) References Cited

U.S. PATENT DOCUMENTS

| | | | |
|---|---|---|---|
| 6,294,476 B1 | 9/2001 | Lin et al. | |
| 6,586,800 B2 | 7/2003 | Brown | |
| 6,835,609 B1 | 12/2004 | Lee et al. | |
| 7,009,250 B1 | 3/2006 | Mouli | |
| 7,148,527 B2 * | 12/2006 | Kim et al. | 257/288 |
| 7,439,580 B2 * | 10/2008 | Kinzer et al. | 257/330 |
| 7,628,932 B2 * | 12/2009 | Lee et al. | 216/104 |
| 2001/0023960 A1 | 9/2001 | Soga et al. | |
| 2006/0049455 A1 | 3/2006 | Jang et al. | |
| 2006/0113590 A1 * | 6/2006 | Kim et al. | 257/330 |
| 2006/0263991 A1 | 11/2006 | Lee | |
| 2006/0289928 A1 * | 12/2006 | Takaya et al. | 257/330 |
| 2007/0063270 A1 | 3/2007 | Cho et al. | |
| 2008/0003753 A1 | 1/2008 | Seo et al. | |
| 2008/0119020 A1 | 5/2008 | Grisham et al. | |
| 2008/0290387 A1 * | 11/2008 | Hwang et al. | 257/300 |

OTHER PUBLICATIONS

Kim et al., S-RCAT (Sphere-shaped-Recess-Channel-Array-Transistor) Technology for 70nm DRAM feature size and beyond; VLSI Technology 2005, Digest of Technical Papers, 2005 Symposium on; Jun. 14-16, 2005; pp. 34-35; IEEE Explore.

* cited by examiner

*Primary Examiner* — David Vu
*Assistant Examiner* — Jonathan Han
(74) *Attorney, Agent, or Firm* — Wells St. John P.S.

(57) ABSTRACT

A method for forming an opening within a semiconductor material comprises forming a neck portion, a rounded portion below the neck portion and, in some embodiments, a protruding portion below the rounded portion. This opening may be filled with a conductor, a dielectric, or both. Embodiments to form a transistor gate, shallow trench isolation, and an isolation material separating a transistor source and drain are disclosed. Device structures formed by the method are also described.

25 Claims, 14 Drawing Sheets

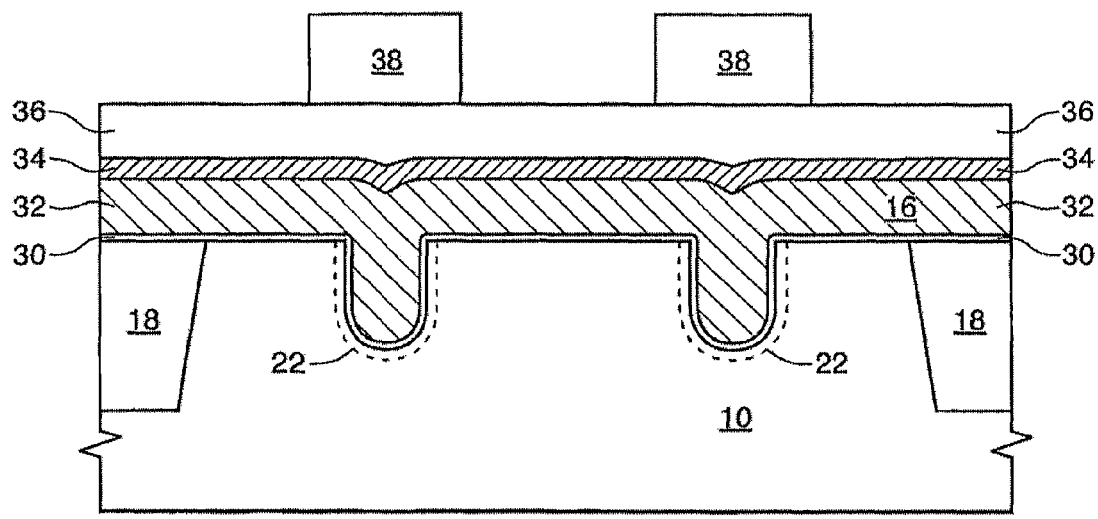
FIG. 3    (RELATED ART)
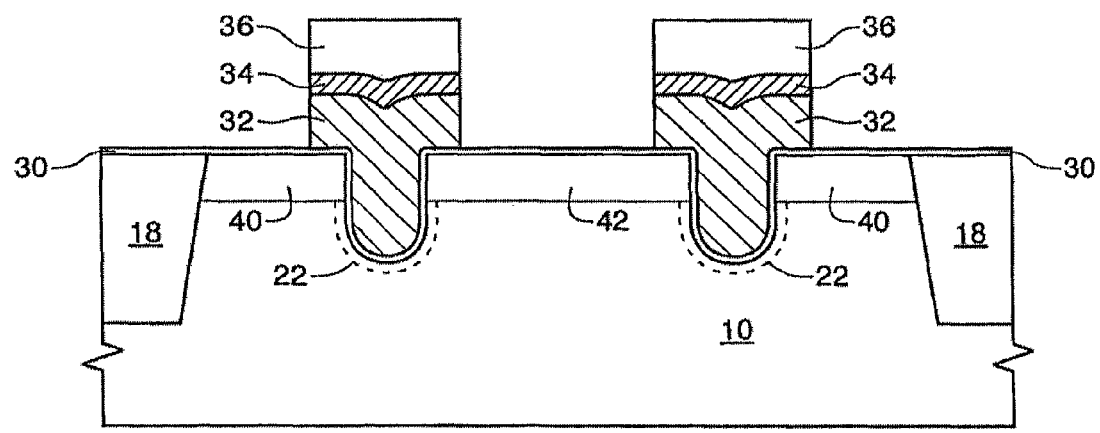
FIG. 4    (RELATED ART)

SEMICONDUCTOR DEVICE COMPRISING TRANSISTOR STRUCTURES AND METHODS FOR FORMING SAME

RELATED PATENT DATA

This patent resulted from a divisional application of U.S. patent application Ser. No. 11/774,665, filed Jul. 9, 2007, entitled "Semiconductor Device Comprising Transistor Structures and Methods for Forming Same", naming Venkatesan Ananthan as inventor, the disclosure of which is incorporated by reference.

TECHNICAL FIELD

Various embodiments of the present invention relate to the field of semiconductor manufacture and, more particularly, to a method and structure for a recessed access device (RAD) transistor.

BACKGROUND

Manufacture of various semiconductor devices such as memory devices, logic devices, and microprocessors has the common goal of miniaturization. As feature sizes decrease, electrical operation of semiconductor devices, for example transistor functionality, becomes more difficult. One contributing factor to this difficulty is known as the "short channel effect" in which the length of the transistor channel becomes excessively small due to miniaturization. This may result in the transistor activating even though a threshold voltage ($V_t$) has not been applied to the gate. Another obstacle to miniaturization is resistance of the gate, which increases with decreasing cross sectional area.

One type of device which has been developed to overcome gate resistance and the short channel effect of a conventional transistor is referred to as a "recessed access device" or "RAD" transistor. Devices of this type comprise a channel which is longer than conventional devices, but requires only a similar horizontal space. One type of RAD transistor comprises a transistor gate (word line) which is partially formed within a trench in a semiconductor wafer. The channel region is formed along the entire surface of the trench which, in effect, provides a longer channel and increases cross sectional area of the gate without increasing the lateral space required by the transistor.

A conventional method to form an n-channel metal oxide semiconductor (NMOS) RAD transistor is depicted in FIGS. 1-6. FIG. 1 depicts a semiconductor wafer 10, which may be doped predominantly with p-type dopants, and a pad dielectric (pad oxide) 14 formed on a major surface of the semiconductor wafer which protects the wafer 10 from a patterned mask 16, which is typically photoresist. An anisotropic etch is performed on the FIG. 1 structure to form the trench 20 within the wafer 10 as depicted in FIG. 2. Element 22 denotes the future transistor channel. It should be noted that other process flows for forming the depicted structures or functionally similar structures are possible.

After forming the FIG. 2 structure, the photoresist 16 and the pad oxide 14 are removed and a transistor gate oxide material 30 is formed over the exposed semiconductor wafer 10. Next, various blanket transistor gate materials are formed as depicted in FIG. 3, including gate material 32, a silicide material 34, and a nitride capping material 36. Gate material 32 may comprise any or all of doped and undoped polysilicon, titanium nitride, tantalum nitride, and ruthenium. A patterned photoresist material 38 is then formed which may be used to define the transistor gate. The FIG. 3 structure is anisotropically etched towards the gate oxide 30, the photoresist material 38 is removed, and a source-drain implant is performed to provide cell 40 and digit 42 (i.e. source and drain) regions and to result in the formation of the transistor gate of FIG. 4, which comprises materials 32, 34, and 36. A blanket spacer material 50, for example silicon nitride, is formed over the structure of FIG. 4 to result in the FIG. 5 structure, and a spacer etch is then performed to form insulative spacers 60 around the transistor gate as depicted in FIG. 6. The formation of the insulative spacers 60 also completes the transistor gate structure. In the structure of FIG. 6, implanted regions 40, 42 represent transistor source/drain regions, although other impurity implants, such as a halo implant, may be performed during fabrication.

Another type of RAD device is referred to as a "sphere-shaped recess channel array transistor" (S-RCAT). This device is depicted in FIG. 7, and is described in "S-RCAT (Sphere-shaped Recess Channel Array Transistor) Technology for 70 nm DRAM features size and beyond", J. Y. Kim et al., 2005 Symposium on VLSI Technology Digest of Technical Papers, June 2005, pp. 34-35. The gate 32 comprises a neck 70 and a rounded portion (ball or sphere) 72 formed within the wafer 10. With this device using a 70 nm design rule, the neck 70 is about 770 Å wide and about 660 Å in height, and the rounded portion 72 is about 1,100 Å in diameter. Doped region 40 extends from the upper major surface of the wafer down to about 1/2 the height of rounded portion 72, and is about 1,200 Å below the surface of the wafer. The interface between n-type doped region 40 and the p-type wafer 10 thus defines the metallurgical junction, while the transistor channel 22 is defined by the lower half of the circumference of the rounded portion, which would be about 1,725 Å. The width of the semiconductor wafer material between adjacent balls is 300 Å.

The configuration of the S-RCAT gate has an increased cross sectional area, forms a longer channel, and further reduces short channel effects over a conventional transistor device. However, with the n-type doping of the cell extending from the surface of wafer 10 towards the middle of the rounded portion 72, the metallurgical junction is about 1,200 Å deep. This increased depth over other RAD devices may increase gate induced drain leakage (GIDL) current due to a large overlap of the active area 40 and the gate 32. The RAD device of FIG. 6 avoids this GIDL as the vertical overlap between gate 32 and active area 40 is small, due to the shallow metallurgical junction, depicted as the bottom line of doped region 40.

A method for forming semiconductor device comprising a RAD transistor which has an increase surface area, increased channel length, and decreased overlap between the junction area and the gate than previous devices would be desirable.

BRIEF DESCRIPTION OF THE DRAWINGS

FIGS. 1-6 are cross sections depicting the formation of a conventional recessed access device transistor;

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE ILLUSTRATED EMBODIMENTS

The term "wafer" is to be understood as a semiconductor-based material including silicon, silicon-on-insulator (SOI) or silicon-on-sapphire (SOS) technology, doped and undoped semiconductors, epitaxial materials of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with materials including dielectrics and conductors, and features such as transistors, formed thereover, depending on the particular stage of processing. In addition, the semiconductor need not be silicon-based, but may be based on silicon-germanium, silicon-on-insulator, silicon-on-sapphire, germanium, or gallium arsenide, among others. Further, in the discussion and claims herein, the term "on" used with respect to two materials, one "on" the other, means at least some contact between the materials, while "over" means the materials are in close proximity, but possibly with one or more additional intervening materials such that contact is possible but not required. Directional terms used herein are in reference to the wafer or wafer section, with the bottom of the wafer or wafer section being the "lowest" point, and do not otherwise imply directionality. The term "conformal" describes a coating material in which angles of the underlying material are preserved by the conformal material. The term "about" indicates that the value listed may be somewhat altered, as long as the alteration does not result in nonconformance of the process or structure in question to the illustrated embodiment of the present invention. A "spacer" indicates a material, typically dielectric, formed as a conformal material over uneven topography then anisotropically etched to remove horizontal portions of the material and leaving vertical portions of the material. For purposes of this disclosure, an "isotropic" etch is an etch which removes material in all directions, while an "anisotropic" etch is one which, ideally, removes material vertically. It is not generally feasible to provide an ideal etch, and thus an "isotropic" etch may have some directionality, and an anisotropic etch may have some lateral etching.

Figure 8:
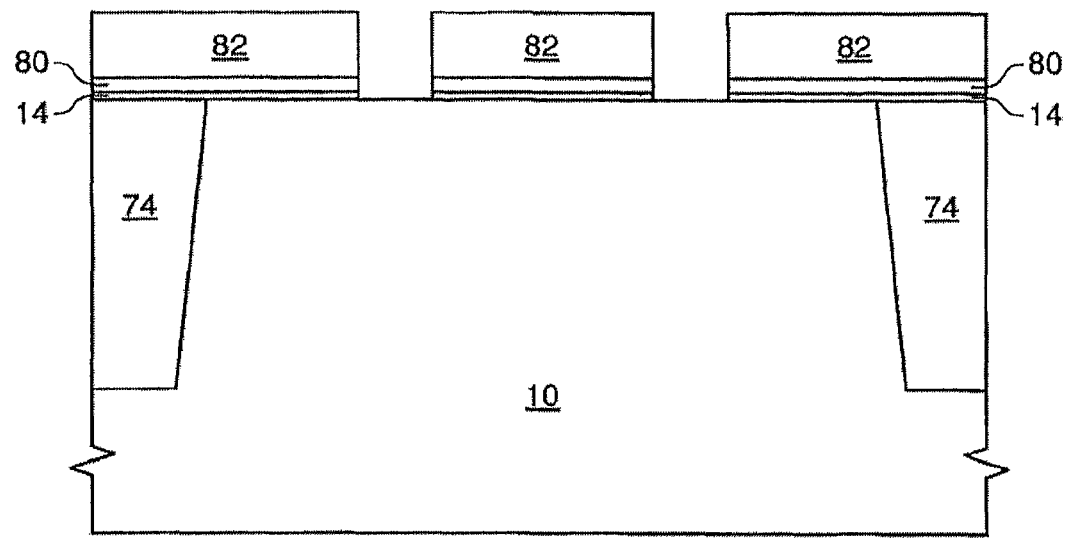
FIGS. 8-20 are cross sections depicting intermediate in-process structures formed during the manufacture of one embodiment of the present invention.

A first embodiment of an inventive method to form a recessed access device (RAD) transistor is depicted in FIGS. 8-18. FIG. 8 depicts a semiconductor wafer 10, for example comprising a p-type conductivity, a pad oxide (pad dielectric) 14, shallow trench isolation (STI) 74, a hard mask 80 such as silicon nitride ($Si_3N_4$), and a patterned mask 82 such as photoresist (resist). Pad oxide 14, which may be from about 50 Å to about 100 Å thick, protects wafer 10 from hard mask 80, which may be from about 250 Å to about 750 Å thick. Pad oxide 14 may be optional depending on the composition of the hard mask. Hard mask 80 may comprise materials other than silicon nitride, but should be resistant to an etch of wafer 10 (i.e. wafer 10 may be etched selective to hard mask 80).

Openings 84 in resist 82 may be from about 50 Å to about 100 Å wide, for example, and depending on the process may be from about 25 Å or less. The structure depicted in FIG. 8 can comprise other features which of course may be fabricated relative to the identified structure, which have not been depicted for clarity and simplicity.

Figure 9:
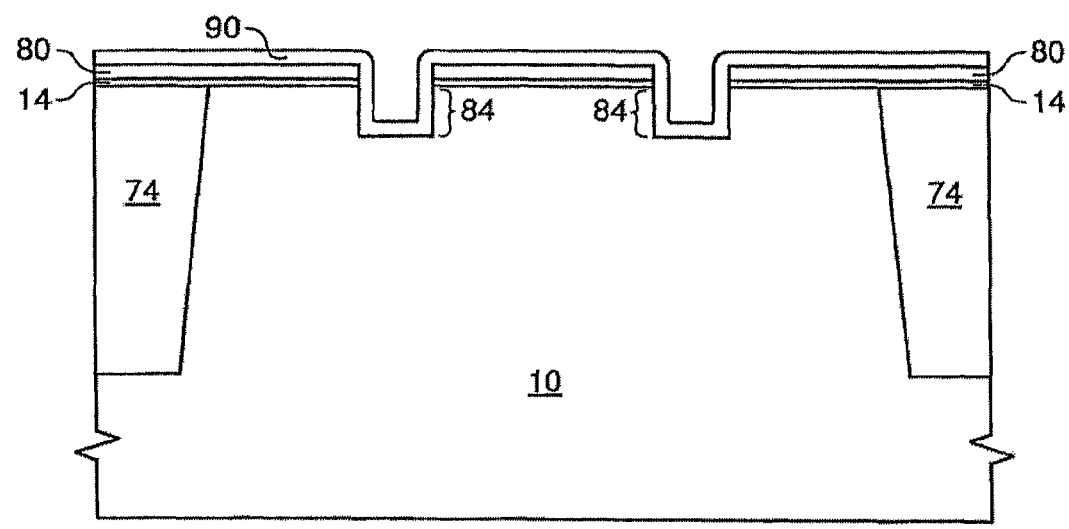

The FIG. 8 structure, specifically hard mask 80, pad dielectric 14, and wafer region 10, is anisotropically etched to result in a structure similar to that depicted in FIG. 9. This etch forms an opening or "neck" portion 84 within wafer 10. In the cross section depicted, the neck 84 comprises two vertically oriented sidewalls. In this embodiment, a sufficient amount of wafer material is removed using known techniques such that a distance from a bottom of the neck portion to the level of the subsequently formed metallurgical junction is about equal to the radius of the desired size of a rounded portion (ball or sphere), also subsequently formed. In one embodiment, the neck portion 84 may be from about 50 Å to about 100 Å deep, the target diameter of the rounded portion may be about 1,100 Å to about 1,200Å, and thus the bottom of the neck portion may be from about 550 Å to about 600 Å from the desired level of the metallurgical junction. The metallurgical junction may thus be from about 600 Å to about 700 Å below an upper planarized major surface of the wafer. After etching the wafer, a conformal spacer material 90 is formed to complete the FIG. 9 structure. In one embodiment, conformal spacer material 90 may comprise a similar material as hard mask 80, for example silicon nitride.

Figure 10:
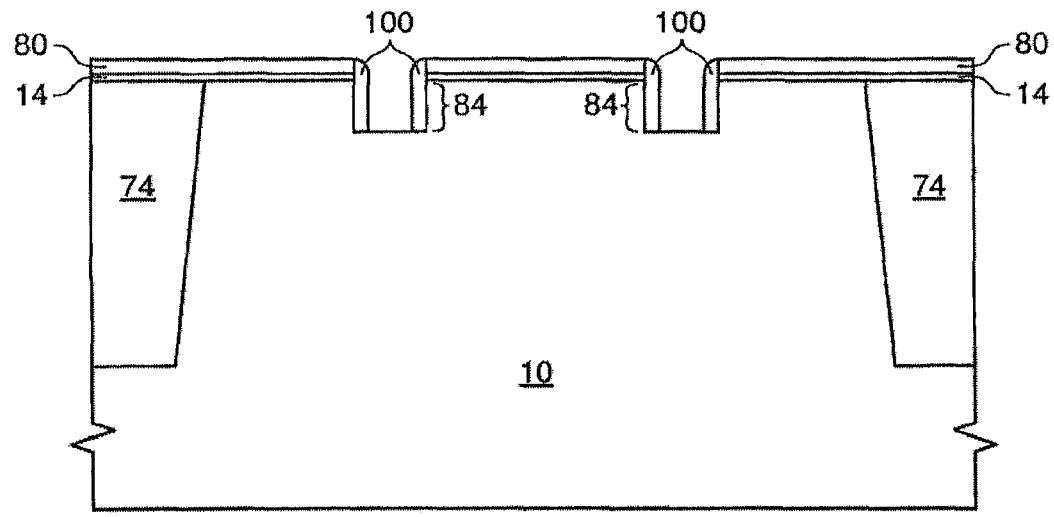
Figure 11:
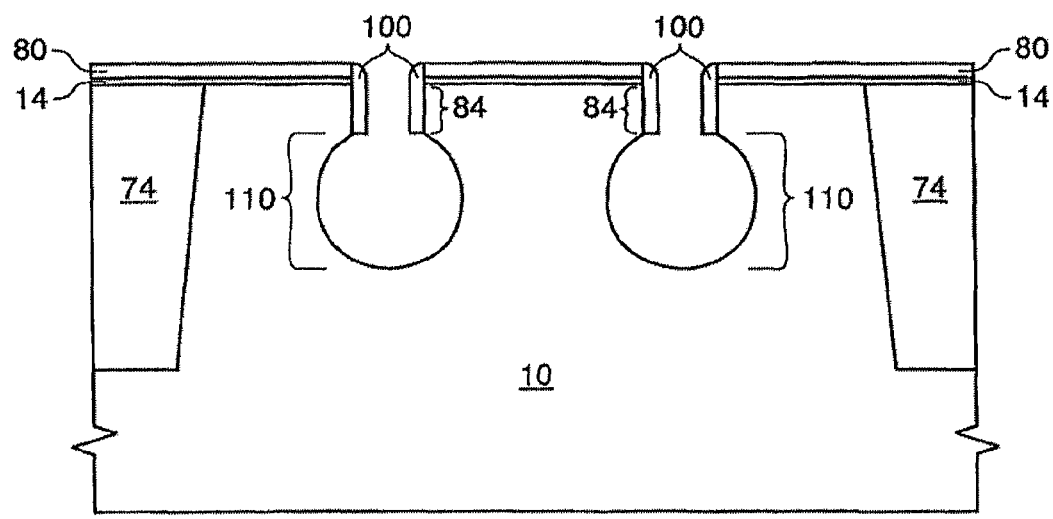

Next, a spacer etch is performed to remove horizontal portions of conformal spacer material 90 to form spacers 100 as depicted in FIG. 10. Alternately, spacers 100 may be formed in situ, in which case the conformal layer need not be deposited. Subsequently, an isotropic etch is performed to remove exposed portions of semiconductor wafer 10 selective to spacers 100 and hard mask 80. This isotropic etch forms rounded portions 110 of the openings in the semiconductor wafer 10 having a diameter of from about 1,100 Å to about 1,200 Å as depicted in FIG. 11. An isotropic etch which may remove monocrystalline silicon wafer 10 selective to silicon nitride spacers 100 and hard mask 80 comprises one or both of $NF_3$ and HBr. During the isotropic etch, hard mask 80 and spacers 100 protect the wafer regions which are not to be removed. In the embodiment depicted in FIG. 11, the center of the spherical portions are targeted for the subsequently formed metallurgical junction which is expected to provide optimized transistor performance.

Figure 12:
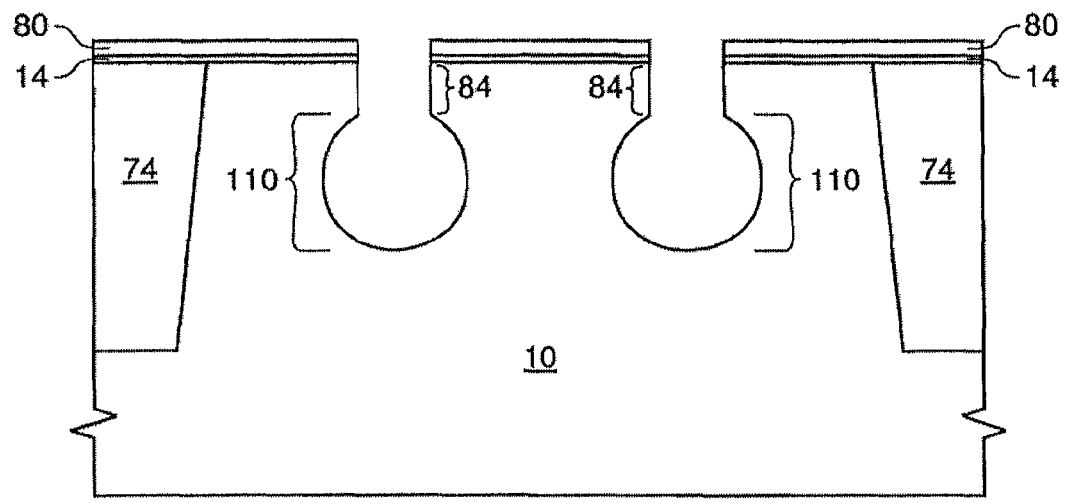

After forming the FIG. 11 structure, spacers 100 may be removed as depicted in FIG. 12, or may be removed during later processing as described below. If the spacers 100 are removed at this point, at least part of hard mask 80 should remain.

Figure 13:
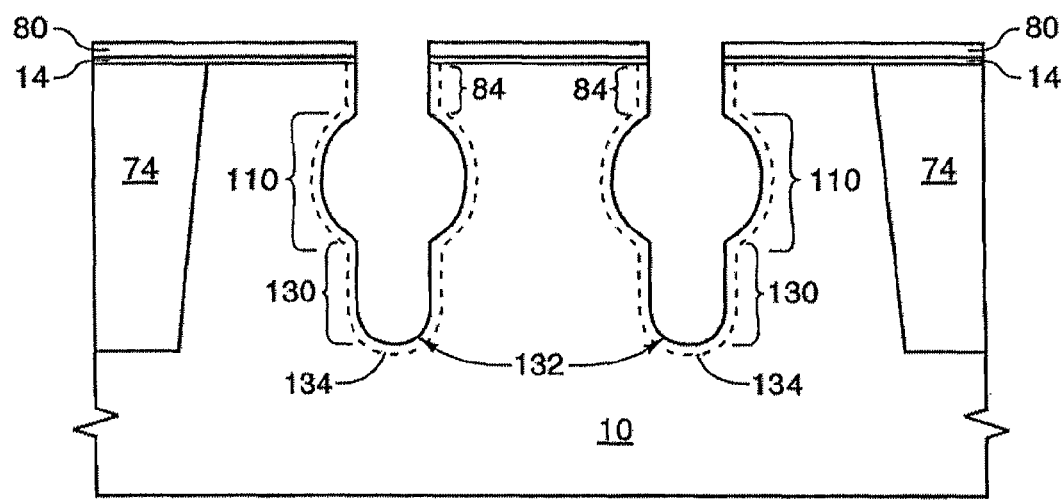

Next, the exposed wafer regions are etched using hard mask 80 to protect the upper surface of semiconductor wafer 10 and may result in a structure similar to FIG. 13. The described etch forms protruding portions 130 extending into the wafer 10 away from each spherical portion 110. In one embodiment, protruding portion 130 may be formed, for example using an etch with an isotropic component, such that the distally extending end 132 may be rounded. Such rounding of distally extending end 132 may improve electrical performance of the completed device. The exposed portions of the wafer are doped to provide doped regions 134.

For the present embodiment, from about 1,000 Å to about 2,000 Å of wafer material may be removed to form protruding portion 130. Removal of excessive wafer material may result in device failure when $V_T$ is applied because of excessive channel length. Minimal material removal may result in minimal effect. The dimensional relationship between the heights of the neck, the rounded portion, and the protruding portion may therefore be optimized for desired transistor characteristics and performance.

Figure 14:
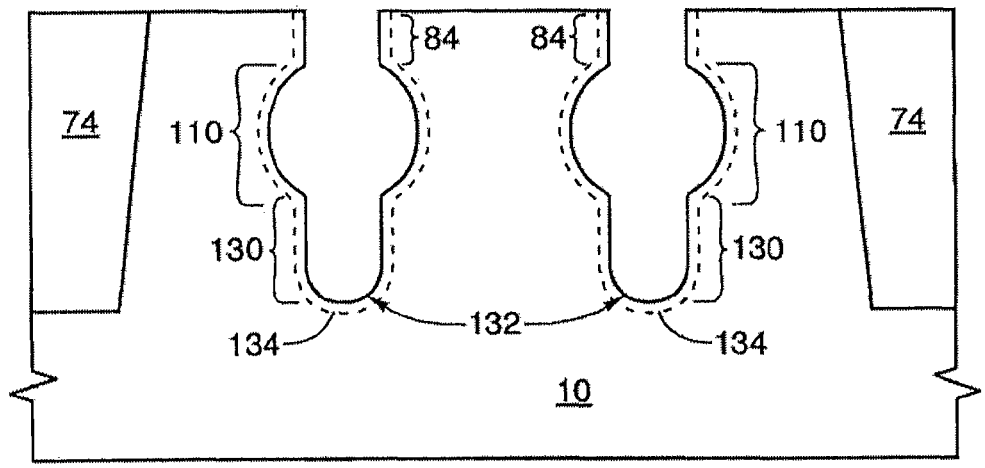
Figure 15:
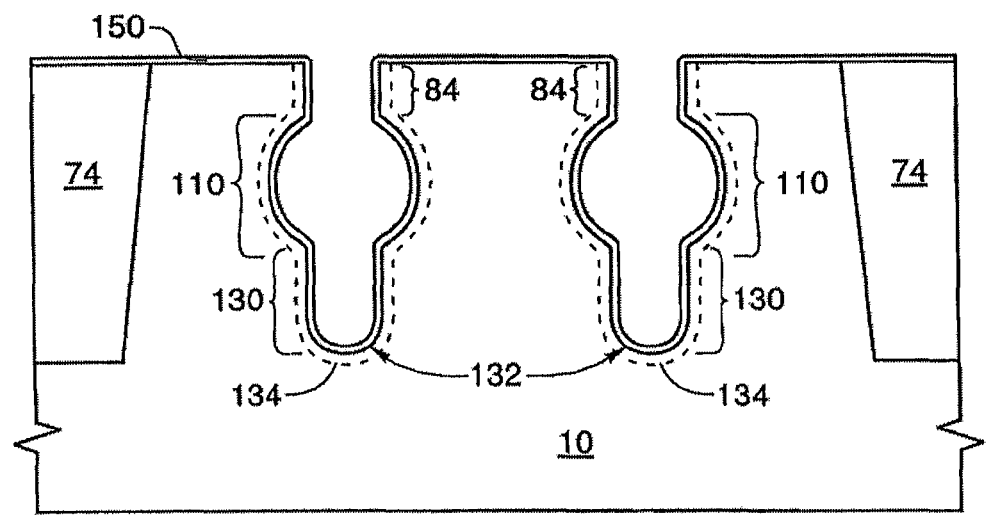

Next, the pad dielectric 14, hard mask 80, and spacers 100 (if not previously etched) are removed to result in the structure of FIG. 14. A gate dielectric 150, for example a gate oxide material from about 10 Å to about 60 Å, is deposited to result in the structure of FIG. 15.

Figure 16:
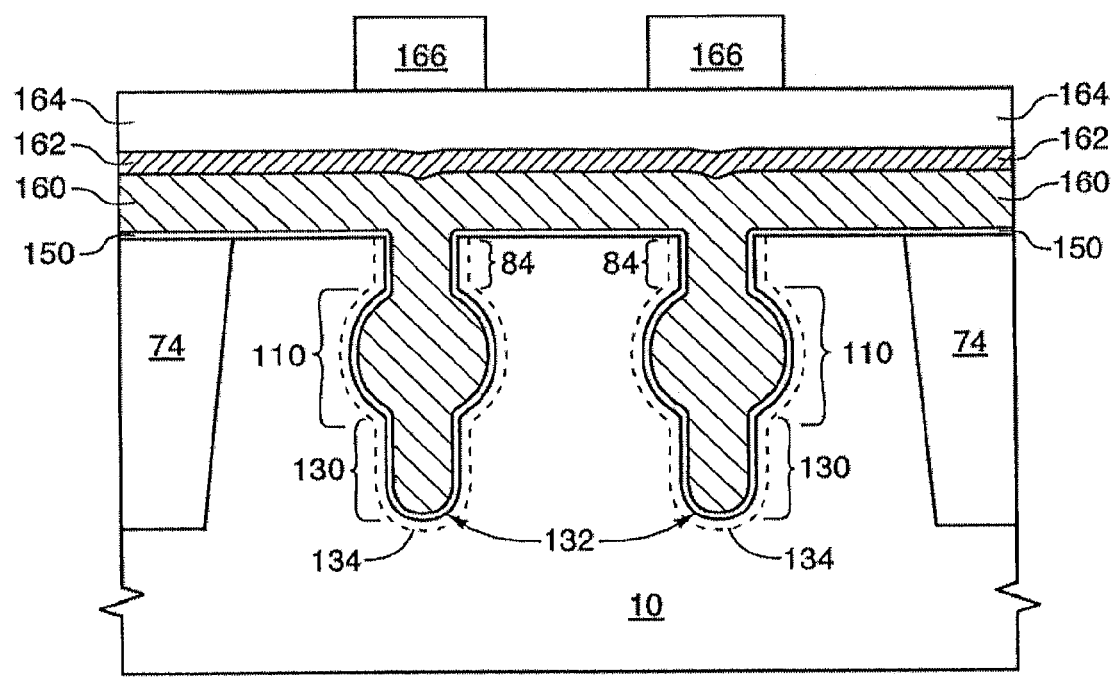
Figure 17:
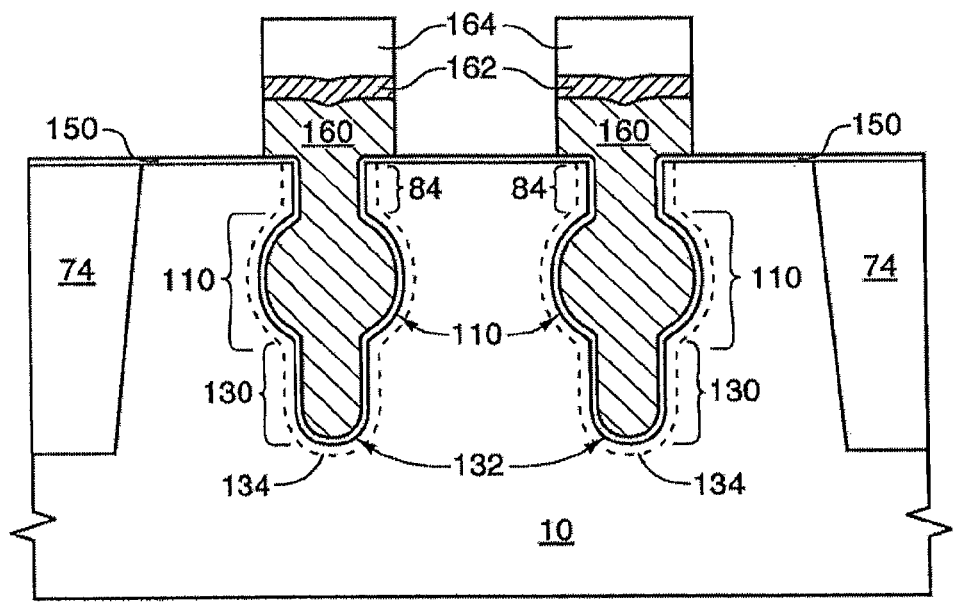

As depicted in FIG. 16, blanket conductive materials 160 and 162 are formed and subsequently covered by blanket dielectric 164, with a patterned resist 166 provided in at least partial contact with blanket dielectric 164. Resist 166 may define a transistor gate stack which may be formed from materials 160-164. Material 160 may comprise one or more of doped or undoped polysilicon, titanium nitride, tantalum nitride, and ruthenium. Material 162 may comprise a silicide such as tungsten silicide. Dielectric 164 may comprise silicon nitride. Other suitable transistor gate stack materials may also be formed. Dielectric material 164 and conductive materials 162 and 160 of FIG. 16 are etched, and resist 168 is then removed to result in the transistor gate stack as depicted in FIG. 17.

Figure 18:
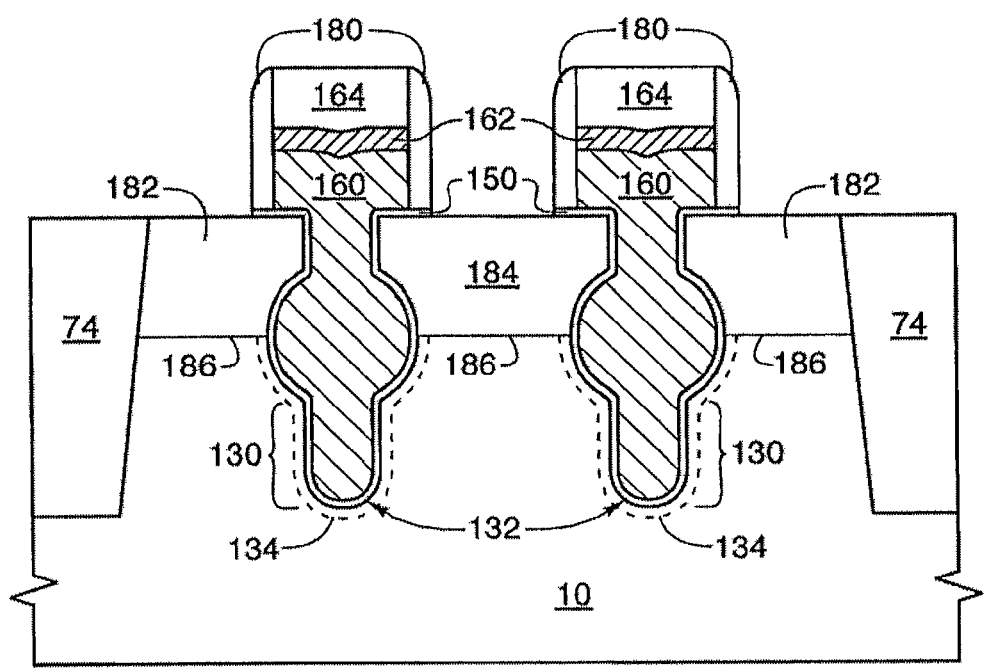

Next, spacers 180 are formed by known techniques as depicted in FIG. 18. Further, n-type impurity dopants may be implanted into the semiconductor material forming cell 182 and digit 184 areas, and defining metallurgical junction 186 of the device. Doped regions 182 and 184 may comprise n-type dopants implanted down to a level at the approximate center of rounded portion 110, for example to a depth of from about 1,000 Å to about 2,000 Å. If dopant migration is expected during subsequent processing, for example resulting from an anneal or other high-temperature processing, the implant depth of doped regions 182 and 184 may be adjusted as needed.

The metallurgical junction 186 is denoted by the lowest extent of the cell and digit areas, and is the point where the number of p-type dopants and n-type dopants are approximately equal. FIG. 18 depicts the metallurgical junction centered vertically on the rounded portion 110 of the gate 32. Wafer processing may then continue to form a completed semiconductor device.

Figure 1:
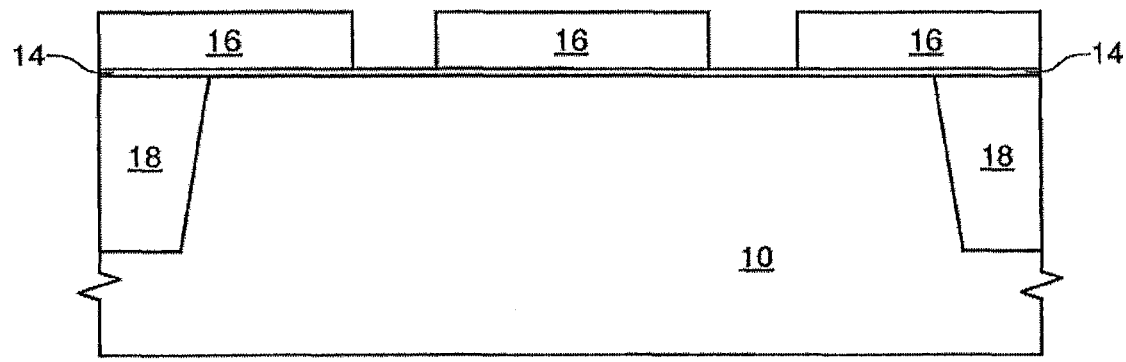
Figure 2:
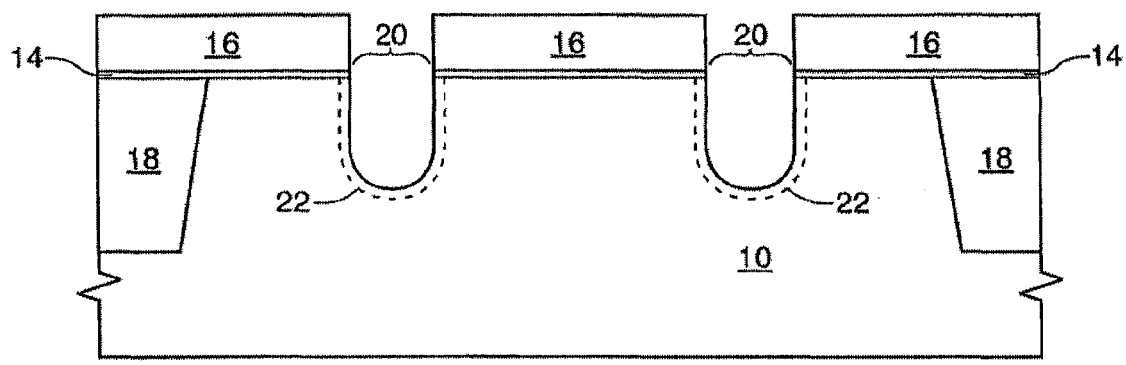
Figure 5:
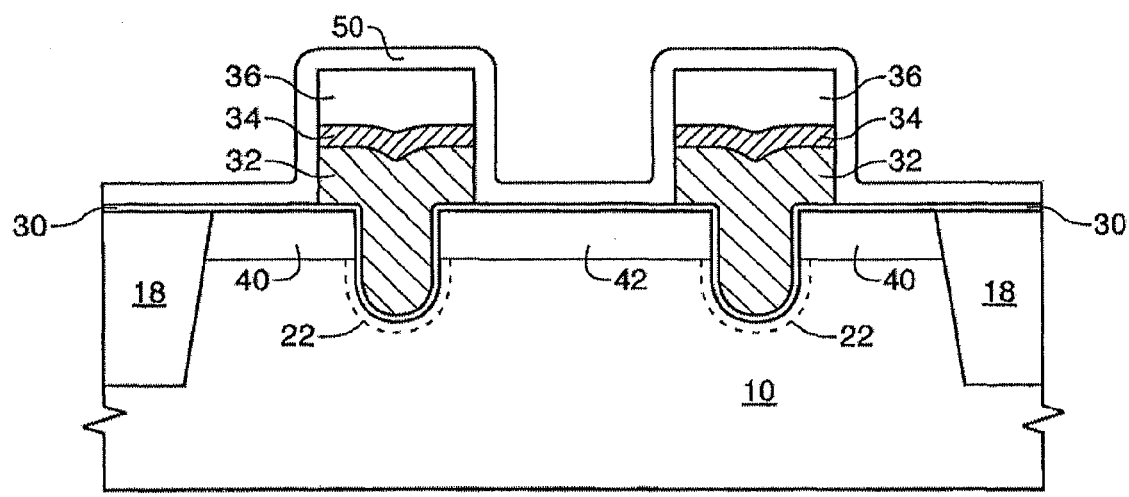
Figure 6:
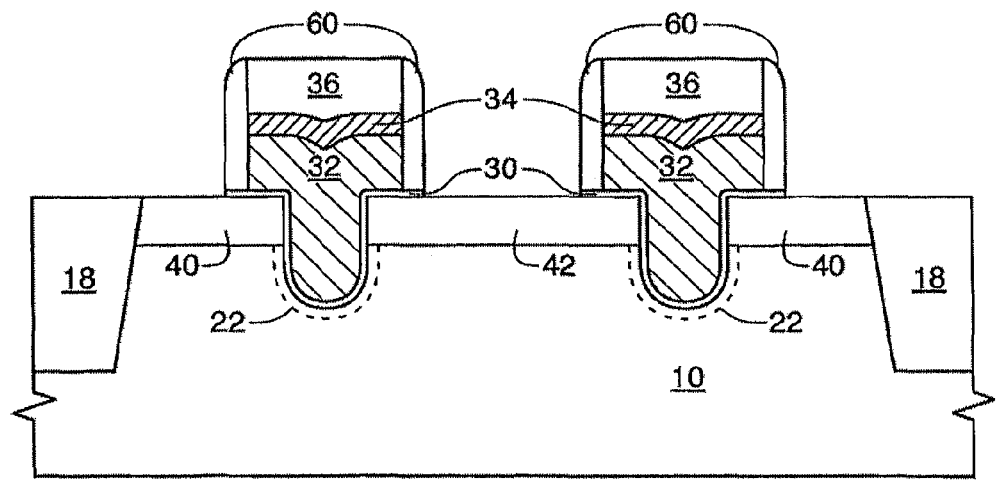
Figure 7:
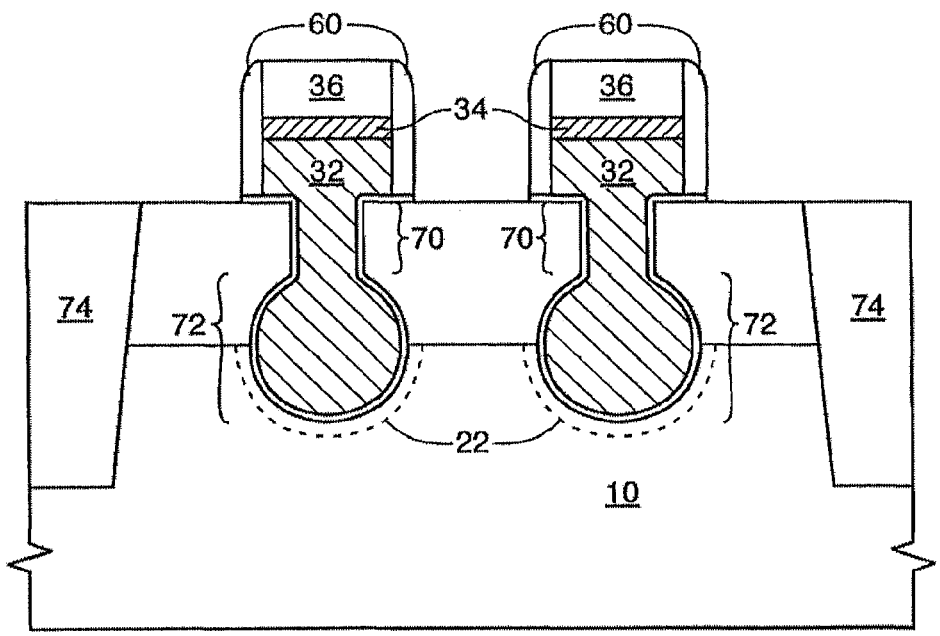
FIG. 7 is a cross section depicting a sphere-shaped recess channel array transistor (S-RCAT) device.

As described above, the metallurgical junction 186 is from about 600 Å to about 700 Å deep within the semiconductor wafer 10 of the completed semiconductor device. This is in contrast to the S-RCAT device depicted in FIG. 7, which comprises a metallurgical junction which is from 1,000 Å to 2,000 Å deep. Thus the vertical overlap of active area with the gate, which is denoted by the depth of the metallurgical junction, is less with the embodiment of the present invention depicted in FIG. 18 than for the related art device of FIG. 7. Thus gate induced drain leakage (GIDL) may be less during use of the present device. Further, the effective length of channel region 134 of the FIG. 18 device is from about 1,550 Å to about 2,600 Å. This is in contrast to the channel 22 of the FIG. 7 device, which is about 500 Å long. Thus the device of the present embodiment may have decreased short channel effects, which results in increased functionality during device operation.

Figure 19:
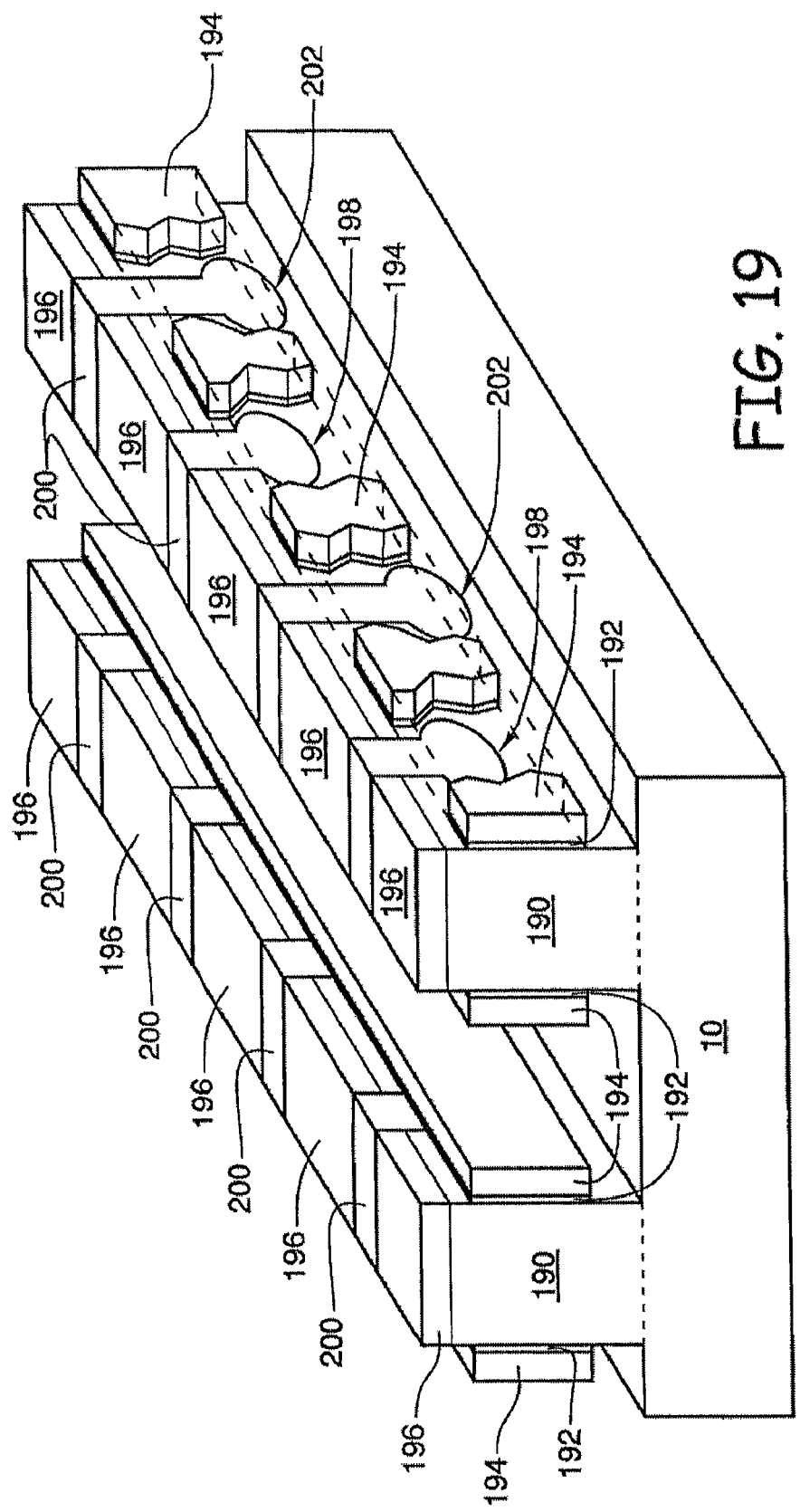

FIG. 19 depicts another embodiment of the invention comprising a fin-shaped field effect transistor (FinFET) device. FIG. 19 depicts a semiconductor wafer 10, a pair of silicon pillars (fins) 190, gate dielectric 192, conductive gates 194, and transistor source/drain (i.e. "cell" and "digit") regions 196. These features may be formed by an artisan of ordinary skill. FIG. 19 further depicts first type openings 198 which have been filled with a dielectric material 200, and second type openings 202 which have been filled with the dielectric material 200.

Dielectric within first type openings 198 provides isolation to separate the implanted cell regions from the digit regions for a single transistor and to define the channel region, while dielectric within second type openings 202 forms shallow trench isolation between transistors. Second type openings 202 are formed to a greater depth within pillars 190 than first type openings 198. The first type openings 198 and second type openings 202 may be formed independently, then simultaneously filled with a single dielectric material. Further, vertically oriented neck portions of the first and second type openings may be formed separately. Similarly, rounded portions of each opening type may also be formed simultaneously.

In one embodiment, the rounded portion of the STI type opening may provide improved isolation over conventional trench isolation for a FinFET device. The rounded portion of the isolation between the impurity-doped cell regions and digit regions 196 for each transistor provides a longer channel to decrease short channel effects for the FinFET device. The rounded portion of the isolation structure between the doped cell and digit regions 196 may be used with conventional STI, or with rounded portion of the STI as depicted. Using the rounded portion of the cell/digit isolation, alone or in conjunction with rounded portion of the STI, provides a FinFET device which may have improved electrical properties over conventional FinFET devices.

Figure 20:
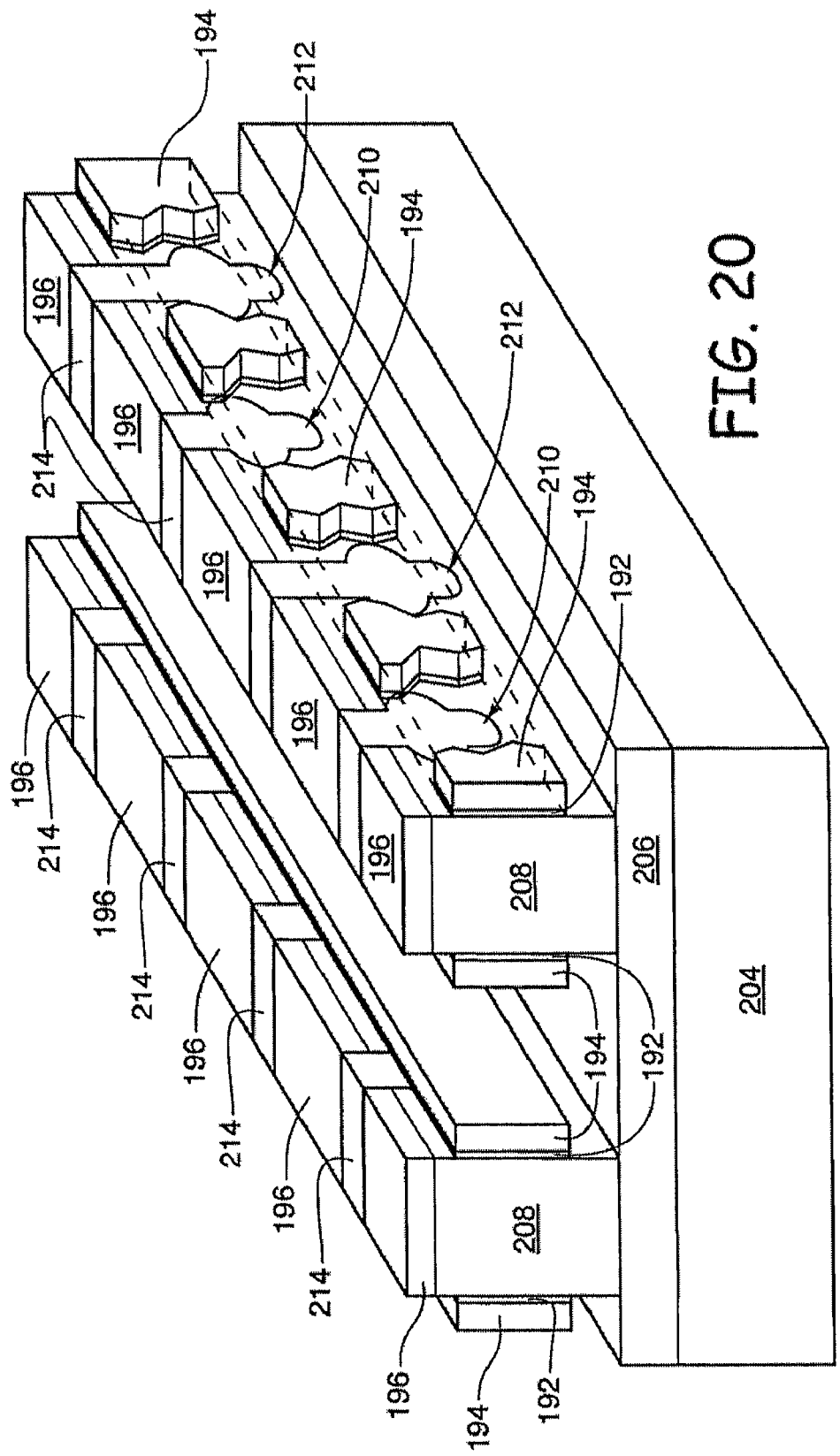

FIG. 20 depicts another embodiment of the invention to provide a FinFET device. This device may, optionally, be a floating body cell FinFET device (FBC FinFET) as depicted using a silicon-on-insulator (SOI) semiconductor wafer. The wafer of the FIG. 20 structure comprises silicon 204 and dielectric 206 such as silicon dioxide used as a base for the FinFET depicted. A similar embodiment may provide a non-FBC device using a standard wafer rather than an SOI wafer.

FIG. 20 depicts gate dielectric 192 and gates 194, as well as other like-numbered structures from the FIG. 19 embodiment. With the FIG. 20 device, pillars (fins) 208 may be formed using an epitaxial silicon material. This depicted embodiment further comprises first type openings 210 and second type openings 212, both filled with dielectric 214. Each of these openings comprises a rounded portion and a protruding portion which may be formed in accordance with the embodiment of FIGS. 8-14. The protruding portion may provide enhanced isolation compared with the strictly rounded isolation of the FIG. 19 embodiment.

Figure 21:
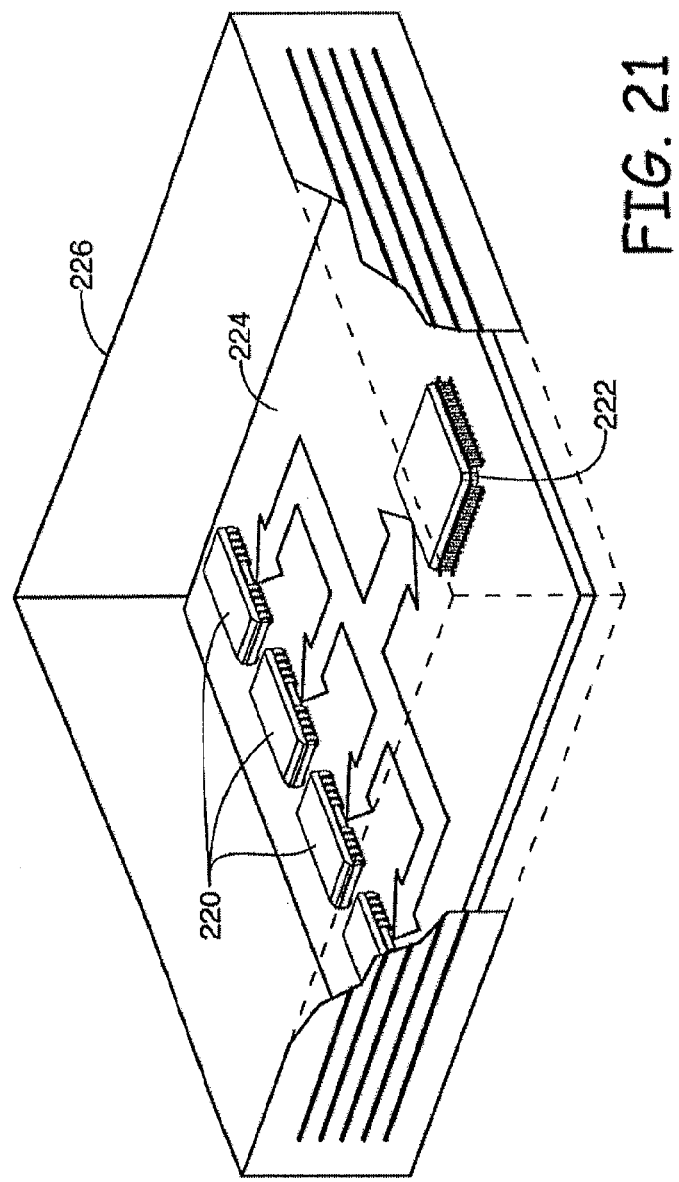
FIG. 21 is an isometric depiction of various components which may be manufactured using devices formed with an embodiment of the present invention.

As depicted in FIG. 21, various semiconductor devices 220 may be attached along with other semiconductor devices such as a microprocessor 222 to a printed circuit board 224, for example to a computer motherboard or as a part of a memory module used in a personal computer, a minicomputer, or a mainframe 226. Any or all of the semiconductor devices 220, 222 may comprise an embodiment of the invention. FIG. 21 may also represent use of device 220 in other electronic devices comprising a housing 226, for example devices comprising a microprocessor 222, related to telecommunications, the automobile industry, semiconductor test and manufacturing equipment, consumer electronics, or virtually any piece of consumer or industrial electronic equipment.

Figure 22:
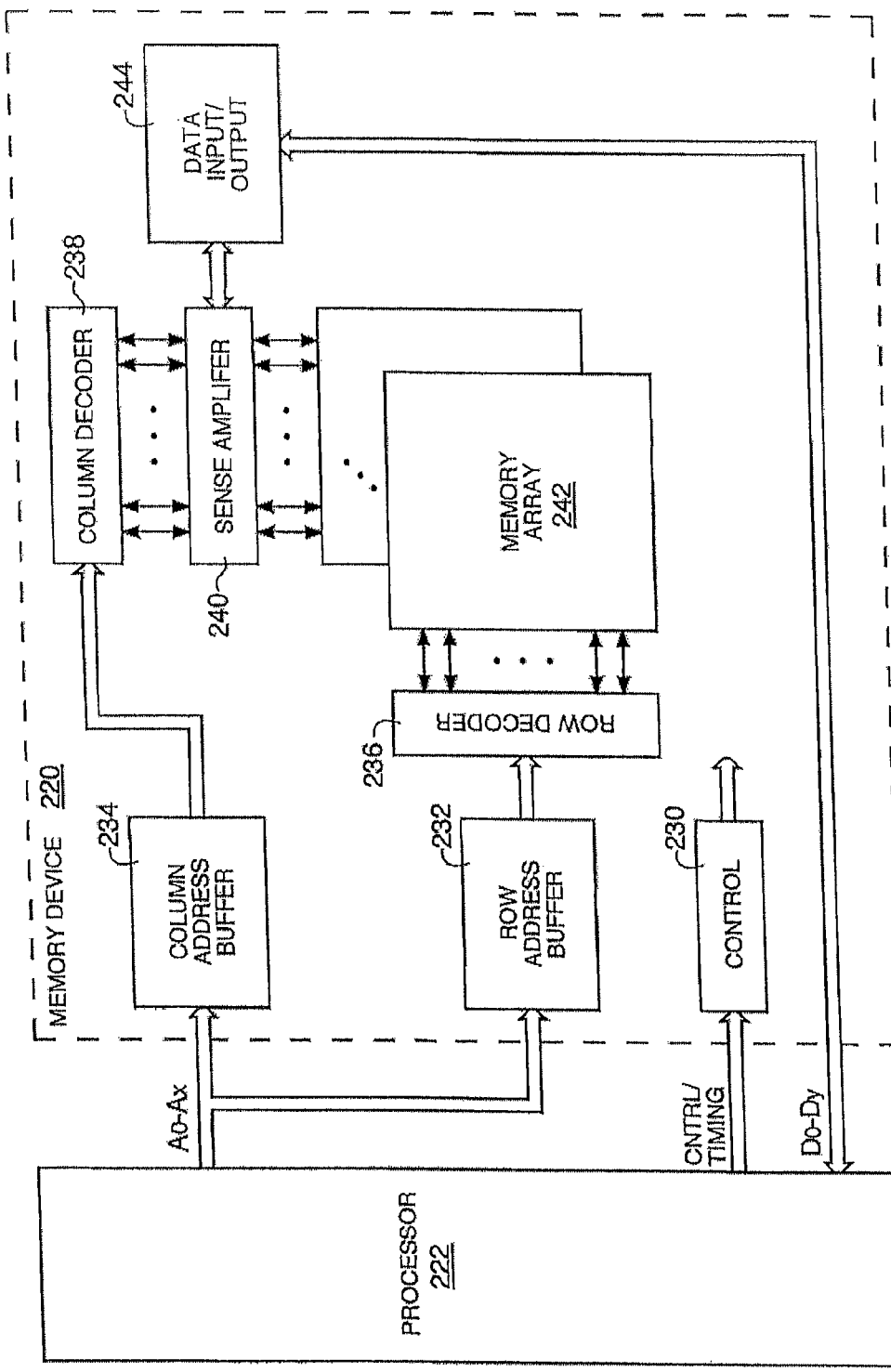
FIG. 22 is a block diagram of an embodiment of the invention to form part of a memory device having a storage transistor array.

The process and structure described herein can be used to manufacture a number of different devices comprising one or more semiconductor structure formed according to the inventive process. FIG. 22, for example, is a simplified block diagram of a memory device having transistor gates which may be formed using an embodiment of the present invention. The general operation of such a device is known to one skilled in the art. FIG. 22 depicts a processor 222 coupled to a memory device 220, and further depicts the following basic sections of a memory integrated circuit: control circuitry 230; row address buffers 232, column address buffers 234; row decoder 236; column decoder 238; sense amplifiers 240; memory array 242; and data input/output 244.

While this disclosure has been described with reference to illustrative embodiments, this description is not meant to be construed in a limiting sense. Various modifications of the illustrative embodiments, as well as additional embodiments of the invention, may be apparent to persons skilled in the art upon reference to this description. For example, the walls of the neck portions and protruding portions may not be vertical as depicted, but may be sloped either intentionally or resulting from isotropic properties of an anisotropic etch. Vertical or sloped sidewalls may be referred to herein as being "vertically oriented." It is therefore contemplated that the appended claims will cover any such modifications or embodiments as fall within the true scope of the invention.

The invention claimed is:

1. A semiconductor device, comprising:
   a semiconductor material having an opening therein, wherein the opening comprises:
   a neck portion having vertically oriented cross sectional sidewalls;
   a rounded portion having cross sectional sidewalls which are continuous with the cross sectional sidewalls of the neck portion;
   a protruding portion having cross sectional sidewalls which are continuous with the cross sectional sidewalls of the rounded portion;
   a gate dielectric contacting the cross sectional sidewalls of the neck portion, the rounded portion, and the protruding portion and;
   a conductive gate material within the neck portion, the rounded portion, and the protruding portion; the conductive gate material within the opening having the same maximum width in the neck portion and protruding portion.

2. The semiconductor device of claim 1 wherein the semiconductor material comprises a major surface and the semiconductor device further comprises a portion of the gate material overlying the major surface of the semiconductor material.

3. The semiconductor device of claim 1 further comprising an impurity region having a metallurgical junction within the semiconductor material, wherein the metallurgical junction lies from about 600 Å to about 700 Å below the major surface of the semiconductor material.

4. The semiconductor device of claim 3 wherein a center of the rounded portion lies from about 600 Å to about 700 Å below the major surface of the semiconductor material.

5. A semiconductor device, comprising:
   a semiconductor material having an opening therein, wherein the opening comprises:
   a neck portion having vertically oriented cross sectional sidewalls;
   a rounded portion having cross sectional sidewalls which are continuous with the cross sectional sidewalls of the neck portion;
   a protruding portion having cross sectional sidewalls which are continuous with the cross sectional sidewalls of the rounded portion;
   a dielectric material filling at least a majority of each of the neck portion, the rounded portion, and the protruding portion; and
   a FinFET device having a source, a drain, and a channel within the fin, the opening with the dielectric material therein being within the fin between the source and the drain.

6. A semiconductor device, comprising:
   a semiconductor material having an opening therein, wherein the opening comprises:
   a neck portion having vertically oriented cross sectional sidewalls;
   a rounded portion having cross sectional sidewalls which are continuous with the cross sectional sidewalls of the neck portion;
   a protruding portion having cross sectional sidewalls which are continuous with the cross sectional sidewalls of the rounded portion; and
   wherein the opening is a first opening and the semiconductor device further comprises:
   a second opening comprising:
      a semiconductor material having an opening therein, wherein the opening comprises:
      a neck portion having vertically oriented cross sectional sidewalls;
      a rounded portion having cross sectional sidewalls which are continuous with the cross sectional sidewalls of the neck portion; and
      a protruding portion having cross sectional sidewalls which are continuous with the cross sectional sidewalls of the rounded portion;
      the neck portion of the second opening being longer than the neck portion of the first opening;
      a center of the rounded portion of the second opening being deeper within the semiconductor material than a center of the rounded portion of the first opening; and
      a bottom of the protruding portion of the second opening being deeper within the semiconductor material than a bottom of the protruding portion of the first opening.

7. The semiconductor device of claim 6 further comprising a dielectric material which fills the first and second openings, wherein the dielectric material within the second opening provides shallow trench isolation and the dielectric material within the first opening providing isolation between a source and a drain of a single transistor.

8. The semiconductor device of claim 7 further comprising a transistor channel region, wherein the transistor channel region extends within the semiconductor material from a first side of the rounded portion of the first opening at a level of about a center of the rounded portion of the first opening, around a bottom of the protruding portion of the first opening, and to a second side of the rounded portion of the first opening at a level of about the center of the rounded portion.

9. A semiconductor device, comprising:
   a semiconductor material having an opening therein, wherein the opening comprises:
   a neck portion having vertically oriented cross sectional sidewalls;
   a rounded portion having cross sectional sidewalls which are continuous with the cross sectional sidewalls of the neck portion;
   wherein the opening is a first opening and the semiconductor device further comprises:
   a second opening comprising:
      a semiconductor material having an opening therein, wherein the opening comprises:
      a neck portion having vertically oriented cross sectional sidewalls;

a rounded portion having cross sectional sidewalls which are continuous with the cross sectional sidewalls of the neck portion;

the neck portion of the second opening being longer than the neck portion of the first opening; and a center of the rounded portion of the second opening being deeper within the semiconductor material than a center of the rounded portion of the first opening.

10. The semiconductor device of claim 9 wherein a bottom of the rounded portion of the second opening is deeper within the semiconductor material than a bottom of the rounded portion of the first opening.

11. The semiconductor device of claim 9 further comprising a dielectric material which fills the first and second openings, wherein the dielectric material within the second opening provides shallow trench isolation and the dielectric material within the first opening providing isolation between a source and a drain of a single transistor.

12. The semiconductor device of claim 11 further comprising a transistor channel region, wherein the transistor channel region extends within the semiconductor material from a first side of the rounded portion of the first opening at a level of about a center of the rounded portion of the first opening, around a bottom of the protruding portion of the first opening, and to a second side of the rounded portion of the first opening at a level of about the center of the rounded portion.

13. A semiconductor device comprising:
a plurality of transistors at least partially within a fin of semiconductive material; individual of the transistors comprising a source region in the fin, a drain region in the fin, and a channel region in the fin;

intra-transistor dielectric regions within the fin alternating with inter-transistor dielectric regions within the fin, the intra-transistor dielectric regions being between the source region and the drain region within individual transistors; and a gate dielectric and a conductive gate operatively adjacent the channel region of individual transistors.

14. The semiconductor device of claim 13 wherein the conductive gate comprises a pair of conductive gate lines on opposite sides of the fin.

15. The semiconductor device of claim 13 wherein the inter-transistor dielectric regions extend deeper within the fin than to the intra-transistor dielectric regions.

16. The semiconductor device of claim 13 wherein the intra-transistor dielectric regions individually comprise a neck portion within the fin and a rounded portion within the fin below and wider than the neck portion.

17. The semiconductor device of claim 16 wherein the neck portion comprises vertical sidewalls.

18. The semiconductor device of claim 16 wherein the intra-transistor dielectric regions individually comprise a protruding portion extending inwardly in the fin from the rounded portion.

19. The semiconductor device of claim 18 wherein the protruding portion comprises vertical sidewalls.

20. The semiconductor device of claim 16 wherein the inter-transistor dielectric regions extend deeper within the fin than to the intra-transistor dielectric regions.

21. The semiconductor device of claim 13 wherein the inter-transistor dielectric regions individually comprise a neck portion within the fin and a rounded portion within the fin below and wider than the neck portion.

22. The semiconductor device of claim 21 wherein the neck portion comprises vertical sidewalls.

23. The semiconductor device of claim 21 wherein the inter-transistor dielectric regions individually comprise a protruding portion extending inwardly in the fin from the rounded portion.

24. The semiconductor device of claim 23 wherein the protruding portion comprises vertical sidewalls.

25. The semiconductor device of claim 21 wherein the inter-transistor dielectric regions extend deeper within the fin than to the intra-transistor dielectric regions.

* * * * *